United States Patent [19]

McAdams

[11] 4,293,932

[45] Oct. 6, 1981

[54] REFRESH OPERATIONS FOR SEMICONDUCTOR MEMORY

[75] Inventor: Hugh P. McAdams, Houston, Tex.

[73] Assignee: Texas Instruments Incorporated, Dallas, Tex.

[21] Appl. No.: 120,594

[22] Filed: Feb. 11, 1980

[51] Int. Cl.³ .............................................. G11C 7/00
[52] U.S. Cl. ..................................... 365/222; 365/233
[58] Field of Search ........................ 365/222, 233, 230

[56] References Cited

U.S. PATENT DOCUMENTS 3,778,784  12/1973  Karp et al. ........................... 365/233
3,969,706  7/1976  Proebsting et al. .................. 365/233
4,207,618  6/1980  White et al. ......................... 365/222

Primary Examiner—Stuart N. Hecker
Attorney, Agent, or Firm—John G. Graham

[57] ABSTRACT

A random access read/write MOS memory device employs an array of rows and columns of dynamic memory cells which are accessed by multiplexed row and column addresses latched in by row address strobe and column address strobe signals. For refresh operations, only the row address is needed, so no column address strobe occurs. During long periods of refresh-only operations, deterioration of internal clocks based on the column address strobe signal is avoided by boosting these clocks from the row address strobe signal.

9 Claims, 9 Drawing Figures

4,293,932

REFRESH OPERATIONS FOR SEMICONDUCTOR MEMORY

BACKGROUND OF THE INVENTION

This invention relates to semiconductor memory devices and more particularly to a dynamic memory device of the type having multiplexed row and column addresses.

The most widely used semiconductor memory devices at present are large scale arrays of one-transistor dynamic memory cells of the type described in U.S. Pat. No. 3,940,747, issued Feb. 24, 1976, to Kuo and Kitagawa, assigned to Texas Instruments. Higher density versions of these memory systems are shown in Electronics, May 13, 1976, pp. 81-86. These high density devices use one-transistor dynamic memory cells which have the advantage of very small size, and thus low cost, but have the disadvantage of requiring external refresh systems. Each row of an array of cells must be addressed periodically to restore the data, since the stored voltages will leak off the capacitors in the memory cells. Refresh imposes both time and hardware burdens on the system.

Usually refresh is accomplished by sequentially accessing all rows of a dynamic RAM, and in typical devices with multiplexed row and column addresses only the row address strobe signal is applied, not the column address strobe signal. Thus, internal clocks based on the column address strobe signal will deteriorate.

It is the object of this invention to provide an improved refresh operating mode in a dynamic RAM of the type having multiplexed row and column addresses, particularly to prevent decay of voltage levels of internal clocks.

SUMMARY OF THE INVENTION

In accordance with one embodiment of the invention, a random access read/write MOS memory device employs an array of rows and columns of dynamic memory cells which are accessed by multiplexed row and column addresses latched in by row address strobe and column address strobe signals. For refresh operations, only the row address is needed, so no column address strobe occurs. During long periods of refresh-only operations, deterioration of internal clocks based on the column address strobe signal is avoided by boosting these clocks from the row address strobe signal.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows:

DETAILED DESCRIPTION OF SPECIFIC EMBODIMENT

The Memory System

Figure 1:
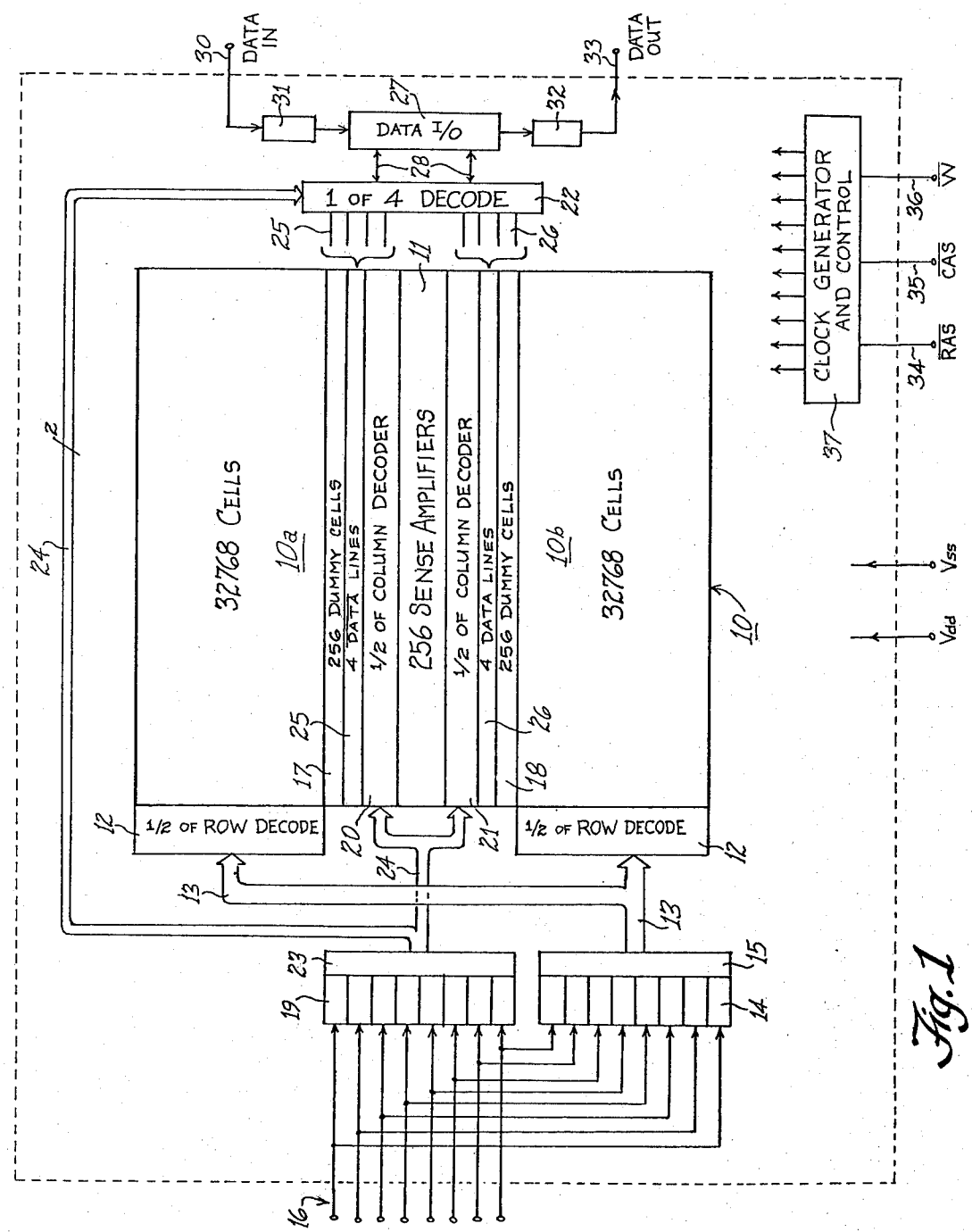
FIG. 1 is an electrical diagram in block form of a semiconductor dynamic memory device which may use the negative undershoot protection circuits of the invention as its inputs.

Referring to FIG. 1, a memory device which may utilize features of the invention in its input circuits is illustrated in block diagram form. This is a random access, read/write memory of the dynamic type, made by an N-channel, self-aligned, silicon gate, double-level-polysilicon, MOS process. All of the memory device of FIG. 1 is included in one silicon chip of about 1/30 of a square inch in size which usually would be mounted in a standard dual-in-line package having sixteen pins or terminals. The device includes in this example an array 10 of 65,536 memory cells, with the array split into two halves 10a and 10b of 32,768 cells each, in a regular pattern of 256 rows and 256 columns. Of the 256 rows or X lines, there are 128 in the array half 10a and 128 in the half 10b. The 256 column or Y lines are each split in half with one half of each column line being in each of the halves 10a and 10b. There are 256 sense amplifiers 11 in the center of the array; these are differential type bistable circuits made according to the invention disclosed and claimed in U.S. patent application Ser. No. 944,822, filed Sept. 22, 1978 and assigned to Texas Instruments. Each sense amplifier is connected in the center of a column line, so 128 memory cells are connected to each side of each sense amplifier by a column line half. The chip requires only a single +5 V Vdd supply, along with a ground terminal Vss. No internal charge pump is needed because no substrate bias is employed.

A row or X address decoder 12, split into two halves, is connected by sixteen A and $\overline{A}$ lines 13 to eight address buffers or latches 14 via output circuits 15. The buffers 14 have inputs which use the features of the invention as described in detail below. An eight-bit X address at TTL voltage levels is applied to inputs of the address buffers 14 by eight address input terminals 16. The X decoder 12 functions to select one of the 256 row lines as defined by an eight bit address on the input terminals 16; if the selected row line is in the half 10b of the cell array then a row of dummy cells 17 on the opposite side of the sense amplifiers 11 is also activated, while if a line in the half 10a is selected then a row of dummy cells 18 is activated. The address signals on the input lines 16 are multiplexed; the Y address is also applied to these input lines and is latched into a set of eight buffers 19, also using the input circuits according to the invention, from which the address is applied to column decoders 20, 21 and 22 via output circuits 23 and lines 24. A one-of-64 selection is made by the column decoders 20 and 21, so that one group of four columns is connected to sets of four data and data bar lines 25 and 26, based on six bits of the eight bit Y address. A one-of-four decoder 22 selects one pair of the four pairs of lines 25 and 26, based on two bits of the eight bit Y address, and connects the selected pair to a data I/O control circuit 27 via a pair of lines 28. A single bit data input is applied by an input terminal 30 to a data input latch 31, and the output of this latch is coupled to the data I/O control 27. The latch 31 may use the input arrangement having features according to the invention and is of the same circuit design as the address buffer circuits 14 and 19. One-bit data output is connected from the data I/O control 27 through a buffer 32 to a data out terminal 33.

Figure 2:
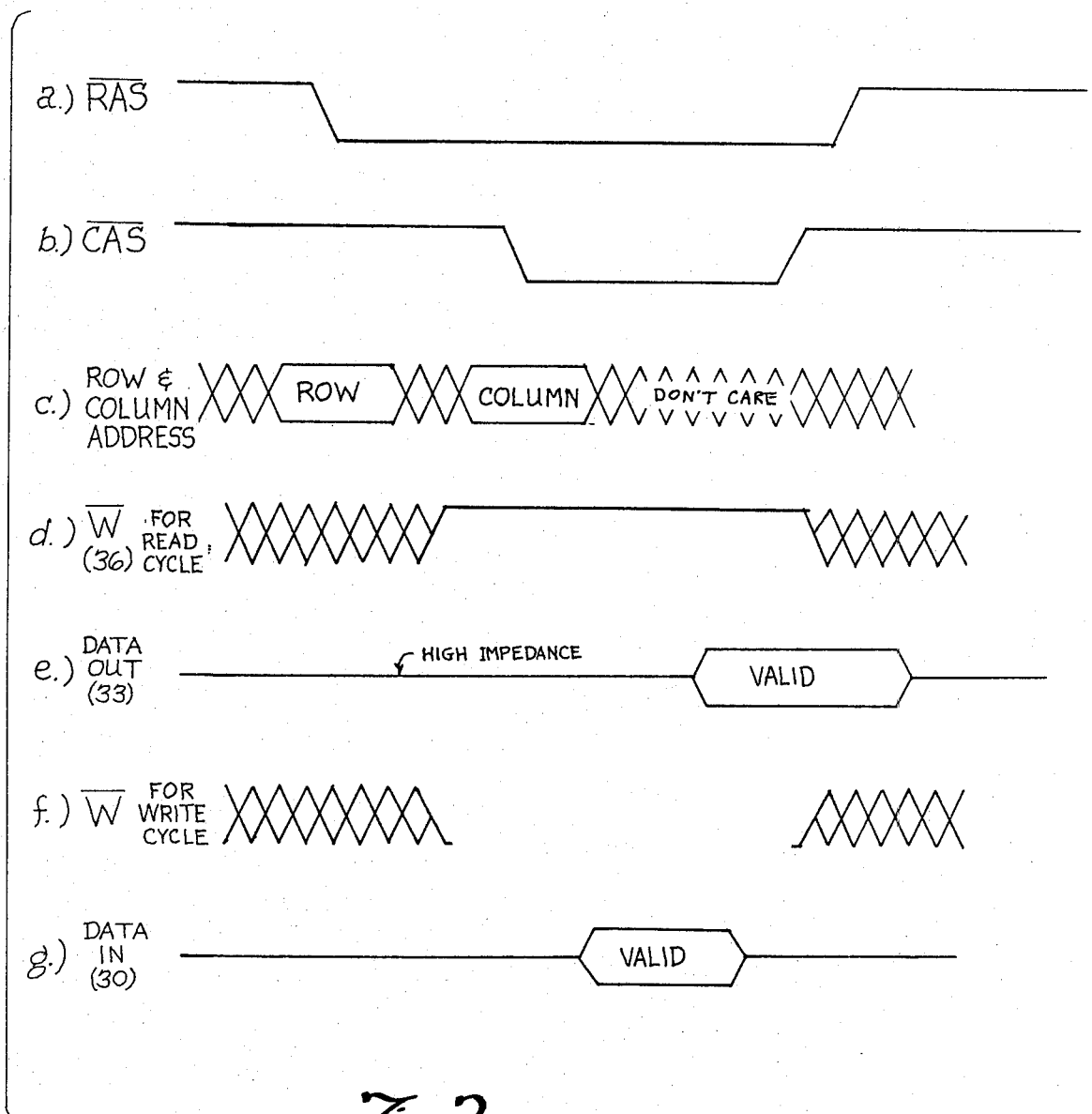
FIGS. 2a-2g are graphic representations of voltage vs time or other conditions vs time existing for various parts of the device of FIG. 1.

The X address must appear on the inputs 16 when a row address strobe signal, referred to as $\overline{RAS}$, is applied to an input 34. Likewise, the Y address must appear during a column address strobe signal $\overline{CAS}$ on an input 35. These inputs 34 and 35 may also use the circuits of the invention. A read/write control $\overline{W}$ on an input 36 is the other control signal for the device. These three inputs are applied through inputs according to the invention to clock generator and control circuitry 37 which generates a large number of clocks and control signals to define the operation of various parts of the device. When $\overline{RAS}$ goes low as seen in FIG. 2a, clocks derived from $\overline{RAS}$ cause the buffers 14 to accept and latch the eight TTL level bits then appearing on the input lines 16. When $\overline{CAS}$ goes low as seen in FIG. 2b then clocks generated in the circuitry 37 cause the buffers 19 to latch on the TTL level Y address signals on the inputs 16. The row and column addresses must be valid during the time periods shown in FIG. 2c. For a read cycle, the $\overline{W}$ signal on input 36 must be high during the period seen in FIG. 2d, and the output on the terminal 33 will be valid during the time seen in FIG. 2e. For a write-only cycle, the $\overline{W}$ signal must be low as seen in FIG. 2f and the data-in bit must be valid during the time seen in FIG. 2g. The data out pin stays in a high impedence state during a write-only cycle. A read/write cycle is also possible.

The Cell Array and Sense Amplifiers

Figure 3:
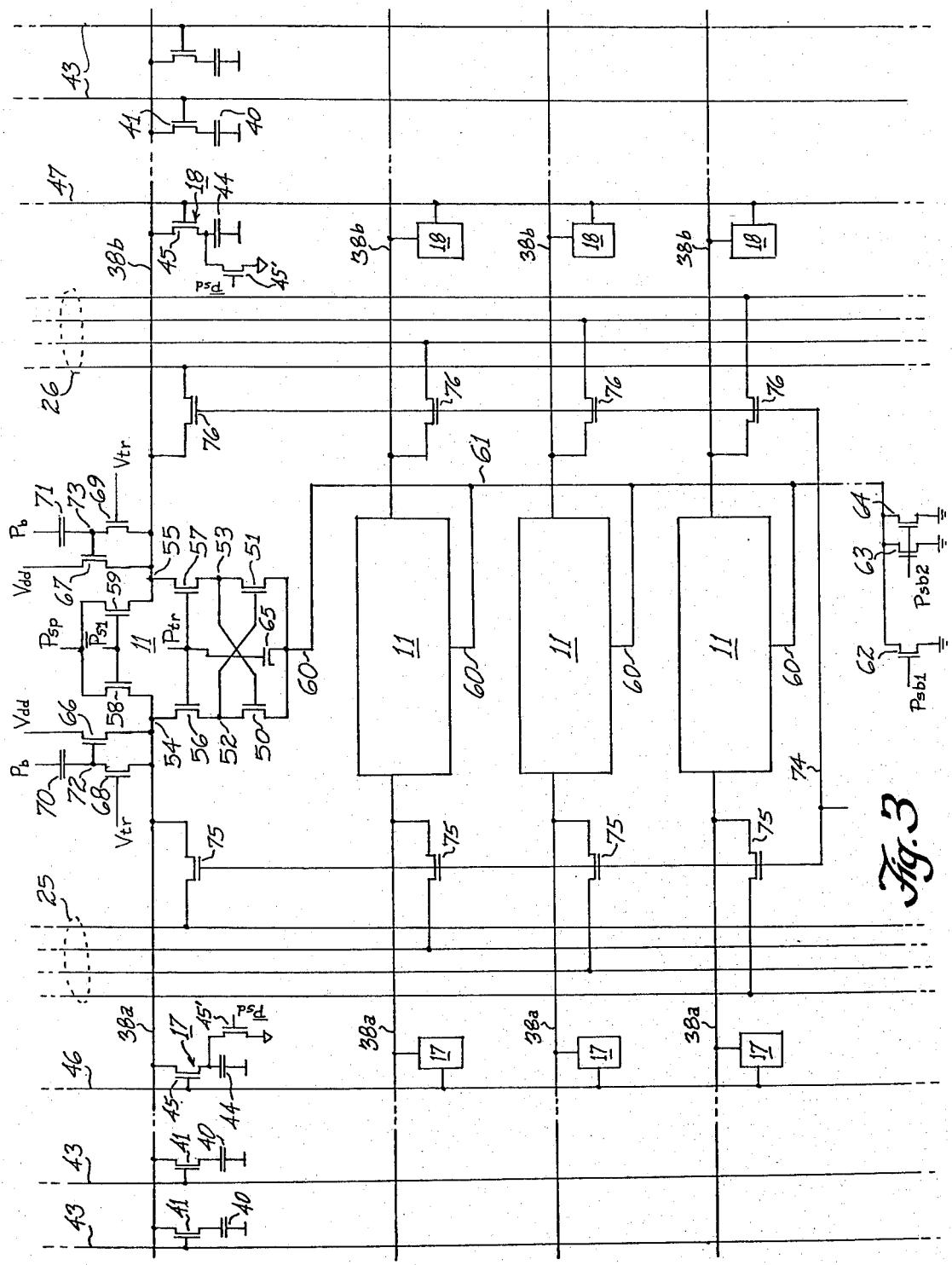
FIG. 3 is an electrical schematic diagram of the cell array in the device of FIG. 1.

In FIG. 3, a portion of the cell array is shown in schematic form. Four identical sense amplifiers 11 are positioned at the center of the array, connected to four column line halves 38a or 38b. Sixty-three other sets of four sense amplifiers and column lines are included in the array. Connected to each column line half 38a or 38b are 128 one-transistor cells each having a storage capacitor 40 and a transistor 41. The cells are of the type described in pending U.S. patent application Ser. No. 648,594, filed Jan. 12, 1976 and Ser. No. 722,841, filed Sept. 13, 1976 by C-K Kuo, both assigned to Texas Instruments, or U.S. Pat. No. 4,012,757. Row lines 43 which are the outputs of the row decoders 12 are connected to the gates of all of the transistors 41 in each row; these are 256 identical row lines 43 in the array. Also connected to each column line half 38a or 38b is a dummy cell 17 or 18 which consists of a storage capacitor 44, an access transistor 45 and a grounding transistor 45'. The gates of all dummy cells in a row are connected to a line 46 or 47. When the X address selects one of the lines 43 on the left, the associated transistor 41 is turned on to connect the capacitor 40 for this selected cell to the column line half 38a, while at the same time the dummy cell select line 47 on the opposite side is activated, connecting the capacitor 44 in one of the cells 18 to the column line half 38b. The dummy cell capacitance 44 is about ⅓ that of the storage cell capacitance 40. The dummy cell is predischarged to a logic zero before every active cycle by 45'.

Figure 4:
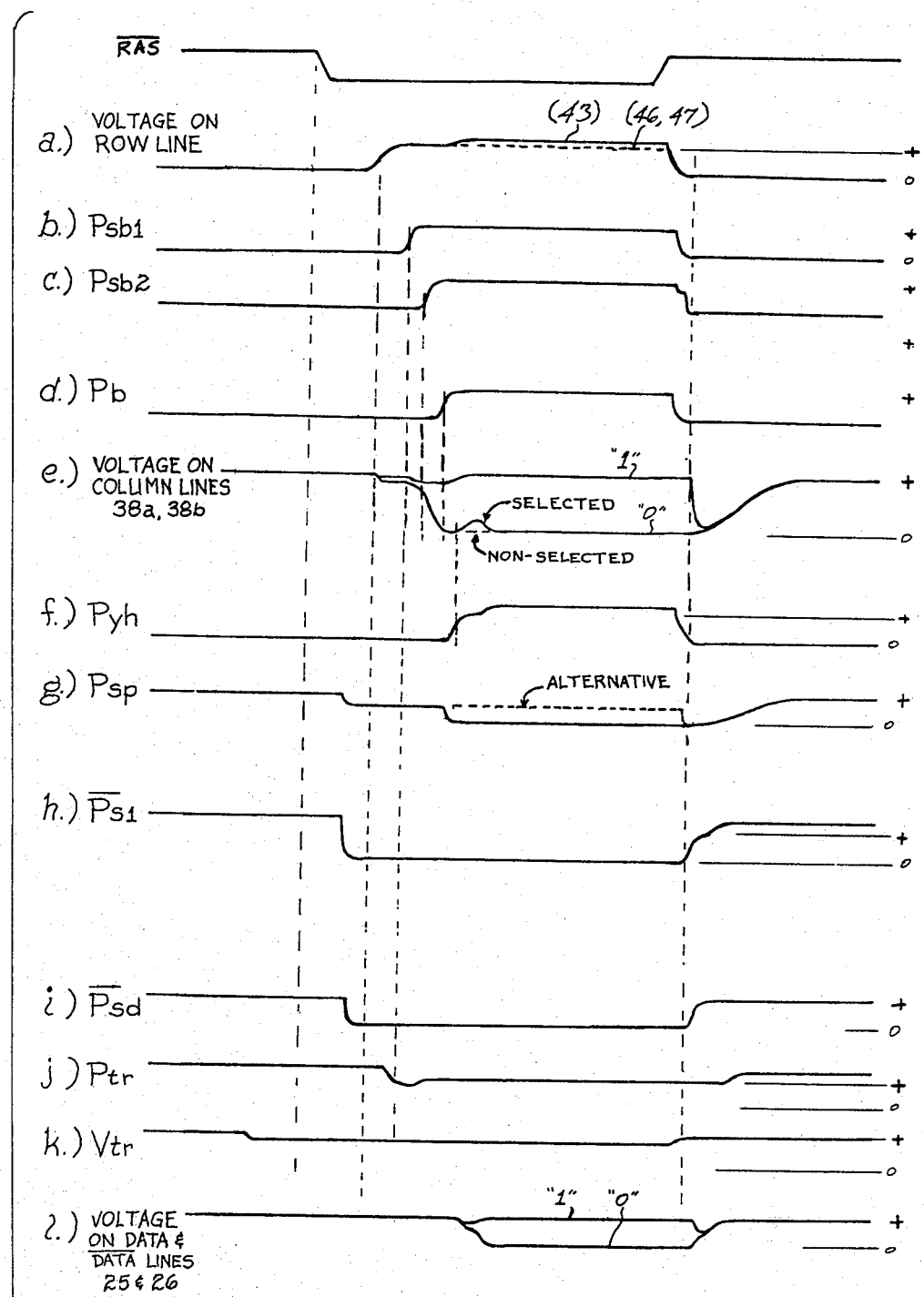
FIGS. 4a-4e are graphic representations of voltage vs time existing in various parts of the circuit of FIG. 3.

The sense amplifier consists of a bistable circuit having a pair of driver transistors 50 and 51, each with its gate connected to the drain 52 or 53 of the other to provide a cross-coupled flip-flop. The drains 52 and 53 are connected to nodes 54 and 55 at the ends of the lines 38a and 38b through the source-to-drain current paths of a pair of coupling transistors 56 and 57. The gates of the transistors 56 and 57 are both connected to a source of a clock voltage Ptr, seen in FIG. 4j. The nodes 54 and 55 and column line halves 38a and 38b are precharged through the source-to-drain current paths of a pair of transistors 58 and 59 connected to a voltage source Psp, shown in FIG. 4g. The gates of the transistors 58 and 59 are connected to a clock voltage $\overline{Ps1}$ seen in FIG. 4h.

The sources of the driver transistors 50 and 51 are connected together at a node 60, and this node 60 is connected by a line 61 to the same node in all of the 256 sense amplifiers 11 in the array. The line 61 is connected to a transistor 62 and a dual channel transistor 63 and 64 which function as grounding paths. The gate of the transistor 62 is connected to a clock Psb1 seen in FIG. 4b, and the common gate of the dual transistors 63 and 64 is connected to a clock Psb2 seen in FIG. 4c. This grounding arrangement is similar to that of application Ser. No. 682,687, filed May 3, 1976, refiled June 30, 1978 as Ser. No. 920,755, assigned to Texas Instruments. The two current paths of the dual transistor 63 and 64 turn on at different times because the channel area of the transistor 64 is ion implanted to raise its threshold votage so that it turns on later than the transistor 63 even though the same clock is applied to its gate. The dual transistor 63 and 64 (actually one large transistor with different channel implants) is much larger than the transistor 62, in channel width to length ratio. Alternatively, the channel length of 64 would be longer than that of 63.

The column lines halves 38a and 38b along with nodes 54 and 55 are precharged to near Vdd during the precharge part of an operating cycle when both Psp and $\overline{Ps1}$ are high. At this time Ptr is high so the nodes 52 and 53 are precharged also. The transistors 50 and 51 are off because the transistors 62–64 are all off, Psb1 and Psb2 being low. After $\overline{Ps1}$ has gone low, turning off the transistors 58 and 59, and before Psb1 goes high, an X address reaches one of the lines 43 at the same time that one of the dummy cell address lines 46 or 47 is activated. This causes an imbalance in the voltage on the nodes 54 and 55, and the same differential is coupled to the nodes 52 and 53 because the voltage Ptr is higher than Vdd. Then, when Psb1 goes high and the small transistor 62 turns on, the sensing operation is initiated and the nodes separate more as the bistable circuit including the transistors 50 and 51 goes toward a stable condition with one transistor conducting and the other cut off. A slight delay from Psb1, the clock Psb2 goes high to complete the sensing operation by latching the bistable circuit and obtaining a good one/zero set on opposing digit lines. By capacitor 65 along with the parasitic capacitances of the transistor 56 and 57, the voltage Ptr is dynamically level shifted from greater than Vdd down to Vdd; the drop in voltage on the node 60 toward Vss as Psb1 then Psb2 go high is coupled to the gates of the transistors 56 and 57.

An active pull-up circuit is employed in the sense amplifier to allow storage of a full Vdd level. This circuit comprises a pair of pull-up transistors 66 and 67 connecting the nodes 54 and 55 to Vdd, along with control transistors 68 and 69 connecting the gates of the transistors 66 and 67 to the nodes 54 and 55, and capacitors 70 and 71 connecting the gates to a boosting clock Pb occurring after Psb2. The gates of the transistors 68 and 69 are connected to a trap voltage Vtr which stays at a level of about 1Vt below Vdd during the active part of the cycle then at Vdd during the precharge part.

After the sensing operation is essentially completed and Psb2 has come on to render first the low threshold transistor 63 then after a slight delay the higher threshold transistor 64 conductive, a definite logic one and logic zero are set up on the column lines 38a and 38b. Then, about four ns after Psb2 goes high, the selected X line 43 (but not the dummy cell select line) is slowly boosted to a level of Vdd+Vt to permit restoration of a full Vdd level in the capacitor 40 for the selected cell. At the same time the X line 43 is being boosted, the clock Pb goes high to activate the active load circuits. The clock Pb causes level shift at either node 72 or 73 via the gated capacitors 70 and 71. Only one of these nodes will have retained a logic one because the column lines will be near the one/zero set at this time; conduction through the transistors 68 or 69 for the zero-going side will discharge node 72 or 73 and cause the gated capacitor 70 or 71 to exhibit very little capacitance so Pb will not charge the node 72 or 73 for this side. The other node 72 or 73 which retained a one, at near Vdd, will be shifted to greater than Vdd thereby allowing this column line half to be pulled back up to Vdd through transistor 66 or 67. At the same time as Pb occurs, the clock Psp is pulled to Vss.

Selection of one group of four of the 256 column lines 38a and 38b by a Pyh voltage occurs a slight delay from when Psb2 goes high. The one-of-64 column decoder 20 and 21, physically located in the space between the sense amplifiers 11 and the data and data bar lines 25 and 26, produces only one Pyh signal on a line 74 to activate only one set of four transistors 75 coupling nodes 54 to lines 25 and one set of four transistors 76 coupling nodes 55 to lines 26. The remaining sixty-three sets of sense amplifiers 11, although operative for refresh on every read or write cycle, will not be coupled to the data and data bar lines because the Pyh signal on the line 74 will be low for these.

COLUMN ADDRESS PRECHARGE CLOCKS

In the memory device of FIGS. 1 and 3, the capacitors 40 discharge with time and must be refreshed about every four milliseconds to maintain the data stored in the memory. Refresh is accomplished by applying a row address (FIG. 2c) and a $\overline{RAS}$ signal (FIG. 2a) but no column address or a $\overline{CAS}$ signal. The row addresses are incremented after each refresh cycle so every row is refreshed within a time period of 4 ms. In typical computer operations, long periods of time may transpire during which no $\overline{CAS}$ signal appears for a given memory chip because this chip will not be accessed for data, merely refresh. This presents a problem for precharge circuits used for column address or associated with the $\overline{CAS}$ signal. A $\overline{CAS}$ related precharge clock internal to the chip would drop from its intended amplitude of Vdd to a value of Vdd-Vt. Any nodes that are precharged normally to Vdd-Vt by means of source followers would drop an additional threshold voltage to Vdd-2Vt. These drops in voltage could cause circuit malfunction once the CAS signal is activated after an extended period of refresh-only with just $\overline{RAS}$ occurring. To pevent this mode of failure, a $\overline{RAS}$ related precharge clock is used to keep the $\overline{CAS}$ related precharge clock pumped up to its intended Vdd value over an indefinite period of time. The usual circuitry used to generate the $\overline{CAS}$ related precharge clock is not changed by the addition of the circuit of FIG. 5. This circuit makes use of the fact that $\overline{CAS}$ will be high (will not go low as in FIG. 2b) during long refresh periods, while RAS will go low as in FIG. 2a for refresh cycles.

Figure 5:
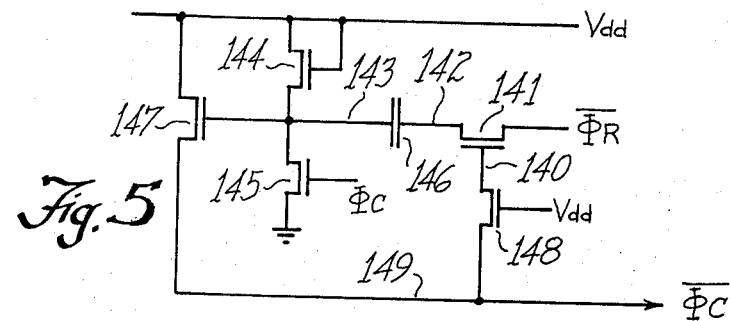
FIGS. 5 and 6 are electrical schematic diagrams of a part of the device of FIG. 1 showing circuits of the invention in detail, according to other embodiments.

In FIG. 5, $\overline{RAS}$-related clock $\overline{\Phi R}$ and $\overline{CAS}$-related clock $\Phi C$ are used. These are of approximately the same timing as $\overline{RAS}$ and $\overline{CAS}$ signals, for the purpose of this explanation, and are generated by the circuitry 37 for use in precharging various other circuits within the chip. Under $\overline{RAS}$-only refresh operation, $\Phi C$ is high, at Vdd, when $\overline{\Phi R}$ is low during the $\overline{RAS}$ active state. Consequently, a node 140 will be high, Vdd-Vt, prior to $\overline{\Phi R}$ going high. So, when $\overline{\Phi R}$ goes high the node 140 will be booted above Vdd by the capacitance associated with the transistor 141, allowing the full Vdd level of $\overline{\Phi R}$ to be transfered to the node 142. Prior to the positive-going transition of $\overline{\Phi R}$, the node 142 is at the Vss potential of $\overline{\Phi R}$ while the node 143 has been charged to Vdd-Vt potential through a transistor 144. $\Phi C$ is at Vss when $\overline{\Phi C}$ is high so that the transistor 145 does not prevent the node 143 from charging up through the transistor 144. When $\overline{\Phi R}$ makes its positive transition, the node 143 is booted above Vdd via the capacitor 146. By making the size of the capacitor 146 of sufficient magnitude relative to the size of transistor 147 and any parisitic capacitance associated with the node 143, the transistor 147 can be assured of being driven into triode operation, thus assuring that $\overline{\Phi C}$ is kept at Vdd potential by resupplying any charge that may have leaked off of $\overline{\Phi C}$. The transistor 141 is used to prevent the positive-going transition of $\overline{\Phi R}$ from causing any conduction in the transistor 147 if $\overline{\Phi C}$ is low during other modes of operation. If $\overline{\Phi C}$ is low when $\overline{\Phi R}$ goes high, transistor 141 will be off and will not allow the node 142 to follow the $\overline{\Phi R}$ transition. The transistor 148 is used as a capacitive isolation device such that the gate of transistor 141 can be booted above Vdd and allow the full transition of $\overline{\Phi R}$ to be coupled to the node 142. The transistor 145 discharges the node 143 when $\overline{CAS}$ is active, preventing any current path through the transistor 147 while $\overline{\Phi C}$ is low (FIG. 2b). The transistor 144 is a long channel device of narrow width to keep down power consumption when $\Phi C$ is high. Charging of the node 143 through the transistor 144 need only occur some time before any substantial leakage has occurred on $\overline{\Phi C}$, which is consistent with a long channel, narrow width transistor 144. If the capacitor 146 is constructed as an MOS gated capacitor it is possible to delete the transistors 141 and 148 and the node 140 and connect $\overline{\Phi R}$ directly to the node 142. Since $\Phi C$ is high when $\overline{\Phi C}$ is low, the node 143 is held low, preventing inversion from occurring in the capacitor 146, so with no inversion region the capacitor consists only of the physical overlap of the node 143 electrode and the N+ diffusion of the node 142. This overlap capacitance is very small compared to the inversion capacitance and the coupling to the node 143 from the positive transition of $\overline{\Phi R}$ can easily be suppressed by the transistor 145.

An example of the use of the output signal $\overline{\Phi C}$ on the line 149 is in generation of clocks such as those employed for column address buffers 19 FIG. 1 or for the $\overline{\Phi C}$ precharge of column decoders 20,21 of FIG. 1.

COLUMN ADDRESS DISCHARGE CIRCUIT

Figure 6:
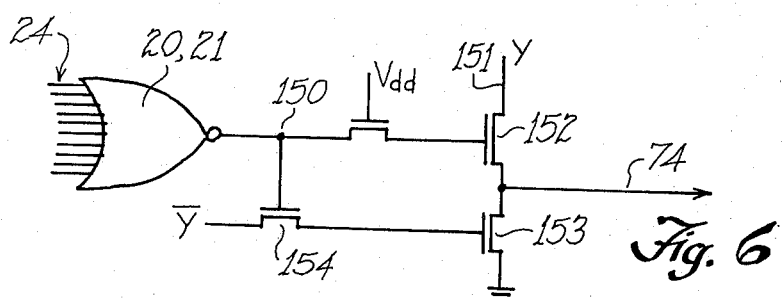
Figure 7:
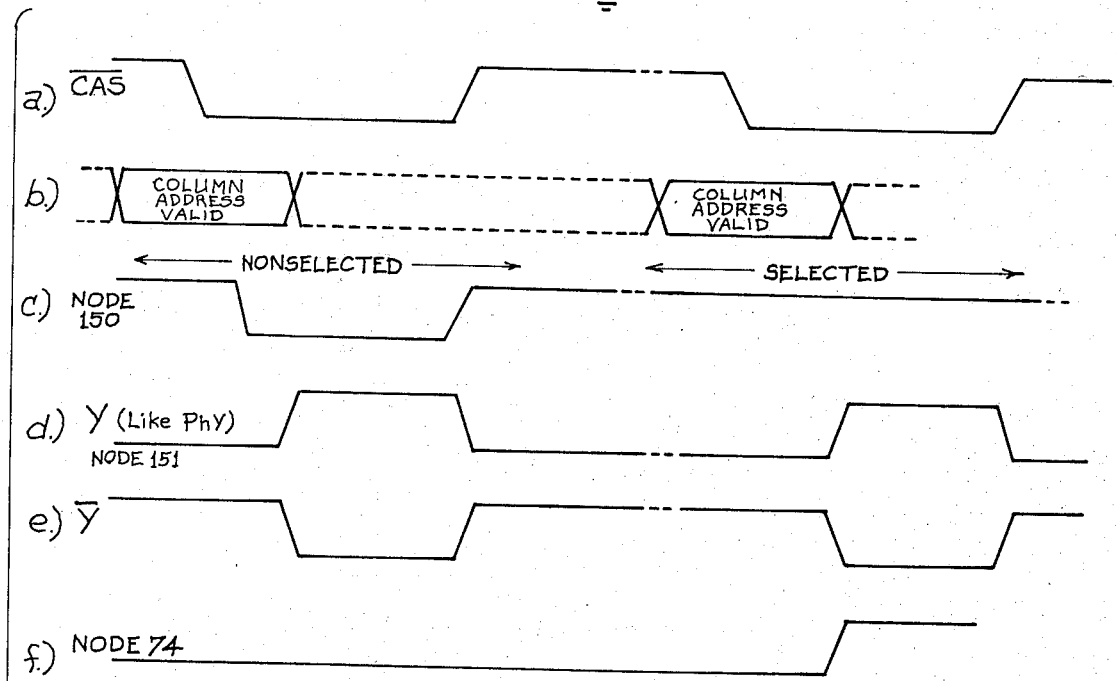
FIGS. 7a-7f are graphic representations of voltage vs time existing at various parts of the circuit of FIG. 6.

Refering to FIG. 6, a circuit is shown for generating column select voltages for applying to the lines 74 of FIG. 3. When the column address signals become valid on the lines 24, one or more of the twelve AY and $\overline{AY}$ address bits on the lines 24 will discharge the decoder output 150 for a non-selected decoder 20,21 as seen in FIG. 7c (left side). There are sixty-four of the decoders 20,21 and only one will remain with its output node 150 in its precharged condition, FIG. 7c (right side). Once all of the sixty-three non-selected decoders have settled, leaving only one decoder in its precharged condition, the Y signal of FIG. 7d, applied to the line 151 from control circuitry (not shown), goes high and this voltage is applied via transistor 152 to the selected line 74 to allow the data on addressed column lines 38a,38b of FIG. 3 to be gated out via transistors 75,76 to the I/O lines 25,26 and on to the I/O buffers. For the non-selected decoders 20,21 since the node 150 has been discharged the Y signal of FIG. 7d is not allowed to pass through the transistor 152 and so the line 74 remains at Vss. The potential on the line 74, however, is trapped on this node with very high impedence to any other node, so the additional circuitry of this improvement is needed.

If both of a pair of the lines 25,26 are pulled to Vss due to data from the selected sense amplifiers 11 or bit lines 38a,38b, one of the bit lines 25,26 goes to its high state due to data being written into the addressed cell, then coupling due to gate overlap capacitance occurs between an I/O line 25, 26 and a line 74, tending to push this line 74 toward a positive voltage above Vss. The magnitude of this voltage is a function of the overlap capacitance between the lines 25,26 and the line 74 via transistors 75,76, the parisitic capacitance associated with the line 74, and the magnitude of the voltage swing on the I/O line 25,26. Since the line 74 is of high impedence to Vss, this voltage remains capacitively stored on the line 74 and will only dissipate due to normal P-N junction leakage. If the magnitude of this coupled voltage on a line 74 is sufficient, it can cause gradual discharge of one of the column lines 38a,38b. If the active cycle is of sufficient length of time, this bit line can become discharged toward Vss, causing the selected storage cell to loose the high state which is to be written into it.

For a high speed dynamic RAM, the time interval between the node 150 going low as in FIG. 7c and the Y signal going high as in FIG. 7d is made as short as possible consistent with proper operation. If on some devices this time interval should be reduced due to processing variations, a small positive voltage could be trapped on a line 74 before discharge of the node 150 is completed. This small voltage is additive to that coupled to the line 74 as described above. This condition can cause poor yields and pattern sensitivities that show up only at certain timing or temperature conditions.

Accordingly, to correct these problems, the circuit of FIG. 6 employs a discharge transistor 153 connecting each of the sixty-four lines 74 to Vss with a $\overline{Y}$ signal as in FIG. 6 applied to its gate through a series transistor 154. The gate of the transistor 154 is connected to the node 150. For the unselected decoders 20,21, the discharge of the node 150 preceeds the discharge of $\overline{Y}$ to Vss. This causes a positive voltage well above Vt to be trapped on the gate of the transistor 153 since the transistor 154 is turned off before Y goes low. The transistor 153 is therefore on and presents a low impedance path to Vss for discharge of any voltage that may be on or be coupled onto the line 74. This prevents the gradual unintentional discharge of a column line and loss of data in a write operation. For the selected decoder 20,21, the node 150 remains in its precharged or high condition so that the transistor 154 is on when Y goes to Vss. Thus the gate of transistor 153 goes low with $\overline{Y}$ and the transistor 153 turns off, so the line 74 can follow Y as it would normally for a selected decoder.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed:

1. A semiconductor memory device of the type having an array of rows and columns of dynamic memory cells, comprising: means for accessing the device by a row address along with a row address strobe signal and by a column address along with a column address strobe signal, said means being activated by either said row address strobe signal only or by both said row and column address strobe signals, and clock generator means in said device for generating clock voltages in response to said column address strobe signal and boosted in voltage by said row address strobe signal.

2. A device according to claim 1 wherein said memory cells are of the one-transistor type having field effect transistors.

3. A device according to claim 1 wherein a row of said cells is refreshed when said means for accessing is activated by a row address strobe signal only.

4. A device according to claim 3 wherein said clock generator means produces a precharge clock for column address which is held at a high voltage by pumping in response to said row address strobe signal.

5. An electronic device comprising: an array of elements; means for accessing the array by a first address along with a first strobe signal and by a second address along with a second strobe signal, said means being activated by either said first strobe signal only or by both said first and second strobe signals; and clock generator means in said device for generating clock voltages for use with said second address and boosted in voltage by said first strobe signal.

6. A device according to claim 5 wherein said device is a semiconductor memory, and said array of elements is an array of memory cells.

7. A device according to claim 6 wherein said memory cells are of the one-transistor MOS type.

8. A device according to claim 7 wherein the cells are in rows and columns and a row is refreshed when the array is accessed by said first address and said first strobe signal.

9. A device according to claim 8 wherein said clock generator means produces a precharge clock for column address which is held at a high voltage by pumping in response to said first strobe signal.

* * * * *